United States Patent
Ebeling et al.

(10) Patent No.: US 9,824,024 B1
(45) Date of Patent: Nov. 21, 2017

(54) CONFIGURABLE STORAGE BLOCKS WITH EMBEDDED FIRST-IN FIRST-OUT AND DELAY LINE CIRCUITRY

(71) Applicant: Altera Corporation, San Jose, CA (US)

(72) Inventors: Carl Ebeling, Redwood City, CA (US); Jeffrey Christopher Chromczak, Brownsville (CA); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 202 days.

(21) Appl. No.: 14/530,576

(22) Filed: Oct. 31, 2014

(51) Int. Cl.
*G06F 12/00* (2006.01)
*G06F 12/1072* (2016.01)
*G06F 12/1009* (2016.01)
*G06F 13/28* (2006.01)
*G06F 12/0875* (2016.01)

(52) U.S. Cl.
CPC ...... *G06F 12/1072* (2013.01); *G06F 12/1009* (2013.01); *G06F 13/287* (2013.01); *G06F 12/0875* (2013.01)

(58) Field of Classification Search
CPC .. G06F 3/0656; G06F 3/0659; G06F 12/0623; G06F 12/1072; G06F 12/1009; G06F 13/287; G06F 13/4256; G06F 13/4278; G06F 13/4295
USPC ........ 711/211, 212, 219, 220; 709/226, 229; 710/14, 36, 221, 225, 249
See application file for complete search history.

(56) References Cited

U.S. PATENT DOCUMENTS

| | | | |
|---|---|---|---|
| 5,228,135 A * | 7/1993 | Ikumi | G06F 12/0853 365/230.05 |
| 5,343,406 A * | 8/1994 | Freeman | H03K 19/1736 326/40 |
| 5,572,148 A | 11/1996 | Lytle et al. | |
| 5,890,195 A * | 3/1999 | Rao | G06F 12/0215 711/104 |
| 6,118,298 A * | 9/2000 | Bauer | G11C 19/00 326/39 |
| 6,262,597 B1 | 7/2001 | Bauer et al. | |
| 6,288,568 B1 | 9/2001 | Bauer et al. | |
| 6,384,627 B1 | 5/2002 | Fross et al. | |
| 6,427,156 B1 * | 7/2002 | Chapman | H03K 19/1737 708/235 |

(Continued)

OTHER PUBLICATIONS

Ito et al., "A Comparison of Microcontrollers Targeted to FPGA-Based Embedded Applications", IEEE, 2000, pp. 397-402.*

(Continued)

*Primary Examiner* — Reba I Elmore
(74) *Attorney, Agent, or Firm* — Tianyi He

(57) ABSTRACT

An integrated circuit may have configurable storage blocks. A configurable storage block may include a memory array, an arithmetic circuit, and a control circuit. The control circuit may be used to determine whether to operate the configurable storage block in a first mode which may provide random access to the memory array or in a second mode which may provide access to the memory array in a predefined order. Thus, the configurable storage block may implement first-in first-out modules, shift registers, or delay-line modules in addition to implementing memory modules with random access.

24 Claims, 10 Drawing Sheets

(56) References Cited

U.S. PATENT DOCUMENTS

| | | | |
|---|---|---|---|
| 6,462,577 B1 | 10/2002 | Lee et al. | |
| 6,574,724 B1* | 6/2003 | Hoyle | G06F 9/30181 |
| | | | 711/200 |
| 7,230,986 B2* | 6/2007 | Wise | G06F 9/3867 |
| | | | 375/240.26 |
| 7,254,687 B1* | 8/2007 | Jeter, Jr. | G06F 9/526 |
| | | | 711/163 |
| 7,269,616 B2* | 9/2007 | Rupp | G06F 7/57 |
| | | | 708/230 |
| 2002/0074481 A1* | 6/2002 | McGrath | H04N 3/155 |
| | | | 250/208.1 |
| 2002/0103978 A1* | 8/2002 | Ma | G06F 15/7814 |
| | | | 711/154 |
| 2006/0184753 A1* | 8/2006 | Jeter, Jr. | G06F 12/0284 |
| | | | 711/154 |
| 2008/0172550 A1* | 7/2008 | Su | G06F 9/30043 |
| | | | 712/225 |
| 2012/0126850 A1* | 5/2012 | Wasson | G06F 15/7867 |
| | | | 326/38 |
| 2014/0247650 A1* | 9/2014 | Kobayashi | G11C 7/1006 |
| | | | 365/149 |

OTHER PUBLICATIONS

Rio et al., "UV151: A Simulation Tool for the Teaching/Learning the 8051 Microcontroller", 30th ASEE/IEEE Frontiers in Education Conference, 2000, F4E-11 to F4E16.*

Lin et al., "Design of a SIMD Multimedia SoC Platform", IEEE, 2007, pp. 51-54.*

Chang et al., "A Semi-Custom Memory Design for an Asynchronous 8051 Microcontroller", IEEE, 2008, pp. 3398-3401.*

\* cited by examiner

US 9,824,024 B1

CONFIGURABLE STORAGE BLOCKS WITH EMBEDDED FIRST-IN FIRST-OUT AND DELAY LINE CIRCUITRY

BACKGROUND

The embodiments presented herein relate to integrated circuits and, more particularly, to configurable storage blocks in an integrated circuit.

Consider a programmable integrated circuit as one example of an integrated circuit. As applications for which programmable integrated circuits are used increase in complexity, it has become more common to design programmable integrated circuits to include specialized blocks such as configurable storage blocks in addition to blocks of generic programmable logic.

Configurable storage blocks are often arranged in arrays of memory elements. In a typical array, data lines are used to write data into and read data from the configurable storage blocks. Address lines may be used to select which of the memory elements are being accessed. A configurable storage block is typically configurable to implement a memory of a given depth and width, whereby the maximum depth is based on the number of address lanes and the maximum width on the number of data lanes.

SUMMARY

In accordance with certain aspects of the invention, a configurable storage circuit may include an address port, a memory array, arithmetic circuitry, and control circuitry, which may be coupled to the memory array, the address port, and the arithmetic circuitry. The control circuitry may select between an address signal from the address port to access storage locations in the memory array in a first access mode and a computed signal from the arithmetic circuitry to access storage locations in the memory array in a predetermined sequence in a second access mode.

It is appreciated that the present invention can be implemented in numerous ways, such as a process, an apparatus, a system, a device, or instructions executed on a programmable processor. Several inventive embodiments are described below.

In certain embodiments, the above-mentioned configurable storage circuit may include a data input port, a data output port, and an enable port which may all be coupled to the memory array. The memory array may receive data from the data input port and an enable signal from the enable port. The control circuitry may direct the memory array to store the data at the storage locations according to the specified access mode if the enable signal enables writing to the memory array. The control circuitry may also direct the memory array to retrieve data from the storage locations according to the specified access mode and to provide the retrieved data at the data output port.

If desired, the arithmetic circuitry may include a counter that is coupled to the enable port and the memory array. The counter may receive the enable signal from the enable port and increase a write address of the memory array based on the enable signal. For example, a register may store the write address, an increment element may receive the stored write address from the register and increase the stored write address by a predetermined number to produce an incremented write address, and a multiplexer that receives the enable signal, the stored write address, and the incremented write address may select between the stored write address and the incremented write address based on the enable signal to produce a selected write address.

Further features of the invention, its nature and various advantages, will be more apparent from the accompanying drawings and the following detailed description of the preferred embodiments.

DETAILED DESCRIPTION

The embodiments described herein relate to integrated circuits and more specifically to configurable storage blocks in an integrated circuit.

Conventional configurable storage blocks often support a pure memory use model in which write operations store data in a memory array at a given address and in which subsequent read operations retrieve the stored data. Typically, only a portion of a user design may perform such memory operations and this portion may vary depending on the design while some integrated circuits may provide a fixed number of configurable storage blocks. Thus, situations frequently arise where the implementation of a user design on an integrated circuit leaves some of the available configurable storage blocks unused. Consequently, it would be desirable to use these configurable storage blocks for the implementation of other design constructs.

For this purpose, a novel configurable storage block may be provided. Such a configurable storage block may facilitate the efficient implementation of typical design constructs such as first-in first-out (FIFO) modules, shift registers, or delay-line modules (DLM).

Providing an integrated circuit with a configurable storage block which allows for efficient implementations of FIFO, shift register, and DLM has several advantages. Such a configurable storage block may implement any FIFO, shift register, or DLM in a user's design and thus mitigate the need for specific logic and routing resources in the integrated circuit, thereby potentially reducing the logic resource usage and routing congestion. The implementation of a FIFO, shift register, or DLM in a configurable storage block may also have deterministic timing and improved performance compared to alternative implementations of the same FIFO, shift register, or DLM. For example, an engineering change order (ECO) that changes the implementation of the FIFO, shift register, or DLM such as adding or removing a stage or changing the control logic may be performed by reconfiguring the configurable storage block and thus without any impact on routing congestion or timing of the integrated circuit implementation.

It will be recognized by one skilled in the art, that the present exemplary embodiments may be practiced without some or all of these specific details. In other instances, well-known operations have not been described in detail in order not to unnecessarily obscure the present embodiments.

Figure 1:
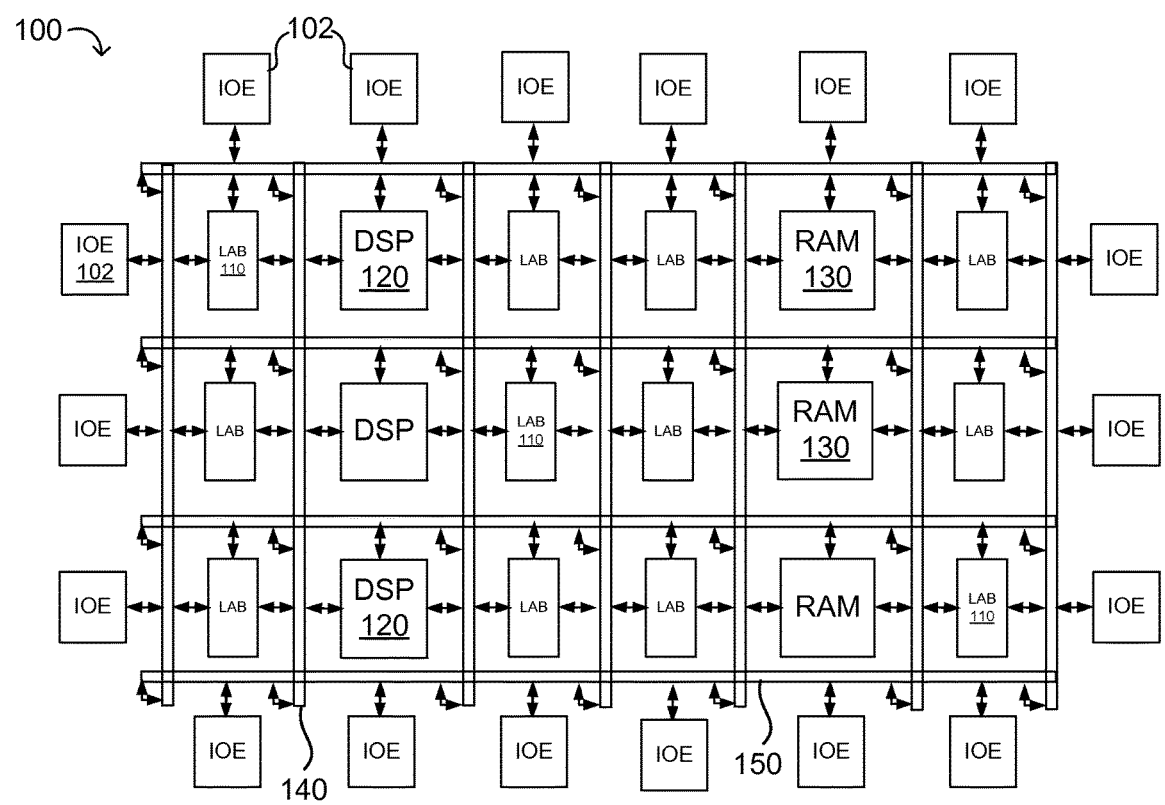
FIG. 1 is a diagram of an illustrative integrated circuit with embedded configurable storage blocks in accordance with an embodiment.

An illustrative embodiment of an integrated circuit such as a programmable integrated circuit 100 is shown in FIG. 1. Programmable integrated circuit 100 may have input-output (I/O) circuitry 102 for driving signals off of programmable integrated circuit 100 and for receiving signals from other devices. Input-output (I/O) circuitry 102 include conventional input-output (I/O) circuitry, serial data transceiver circuitry, differential receiver and transmitter circuitry, or other circuitry used to connect one integrated circuit to another integrated circuit.

As shown, input-output (I/O) circuitry 102 may be located around the periphery of the chip. If desired, the programmable integrated circuit may have input-output (I/O) circuitry 102 arranged in different ways. For example, input-output (I/O) circuitry 102 may form one or more columns of input-output (I/O) circuitry that may be located anywhere on the programmable integrated circuit (e.g., distributed evenly across the width of the programmable integrated circuit). If desired, input-output (I/O) circuitry 102 may form one or more rows of input-output (I/O) elements (e.g., distributed across the height of the programmable integrated circuit). Alternatively, input-output (I/O) circuitry 102 may form islands of input-output (I/O) elements that may be distributed over the surface of the programmable integrated circuit or clustered in selected areas.

Vertical interconnection resources 140 and horizontal interconnection resources 150 such as global and local vertical and horizontal conductive lines and buses may be used to route signals on programmable integrated circuit 100. Vertical and horizontal interconnection resources 140 and 150 include conductive lines and programmable connections between respective conductive lines and are therefore sometimes referred to as programmable interconnects.

Programmable logic regions may include programmable components such as digital signal processing circuitry 120, storage circuitry 130, or other combinational and sequential logic circuitry organized in logic array blocks 110. The programmable logic regions may be configured to perform a custom logic function. If desired, the programmable logic region may include digital signal processing circuitry 120 and storage circuitry 130 which both may be organized in specialized blocks that have limited configurability. The programmable logic region may include additional specialized blocks such as programmable phase-locked loop circuitry, programmable delay-locked loop circuitry, or other specialized blocks with limited configurability.

Programmable integrated circuit 100 contains programmable memory elements. These memory elements can be loaded with configuration data (sometimes also referred to as programming data) using input-output (I/O) circuitry 102. Once loaded, the memory elements each provide a corresponding static control signal that controls the operation of an associated logic component in a programmable logic region.

In a typical scenario, the outputs of the loaded memory elements are applied to the gates of transistors in the programmable logic region to turn certain transistors on or off and thereby configure the logic and the routing paths in the programmable logic region. Programmable logic circuit elements that may be controlled in this way include parts of multiplexers (e.g., multiplexers used for forming routing paths in programmable interconnects or multiplexers used for configuring logic components in a programmable logic region such as digital signal processing circuitry 120 or storage circuitry 130), look-up tables, logic arrays, AND, OR, NAND, and NOR logic gates, pass gates, etc.

Memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements are loaded with configuration data during programming, memory elements are sometimes referred to as configuration memory, configuration RAM, or programmable memory elements.

The circuitry of programmable integrated circuit 100 may be organized using any suitable architecture. As an example, the logic of programmable integrated circuit 100 may be organized in a series of rows and columns of larger programmable logic regions each of which contains multiple smaller logic regions. The smaller regions may be, for example, regions of logic that are sometimes referred to as logic elements (LEs) or basic logic elements (BLEs), each containing a look-up table, one or more registers, and programmable multiplexer circuitry. The smaller regions may also be, for example, regions of logic that are sometimes referred to as adaptive logic modules (ALMs), configurable logic blocks (CLBs), slice, half-slice, etc. Each adaptive logic module may include a pair of adders, a pair of associated registers and a look-up table or other block of shared combinational logic (i.e., resources from a pair of LEs—sometimes referred to as adaptive logic elements or ALEs in this context).

The larger regions may be, for example, logic array blocks 110, which are sometimes also referred to as logic clusters of regions of logic containing multiple logic elements or multiple ALMs. In some embodiments, the larger regions may group several logic elements (LEs) or basic logic elements (BLEs) together to form adder chains or storage circuitry that may be configured as a random-access memory (RAM) block, a first-in first-out (FIFO) module, a shift register, or a delay-line module (DLM), just to name a few.

During device programming, configuration data is loaded into programmable integrated circuit 100 that configures the programmable logic regions so that their logic resources perform desired logic functions.

Figure 2A:
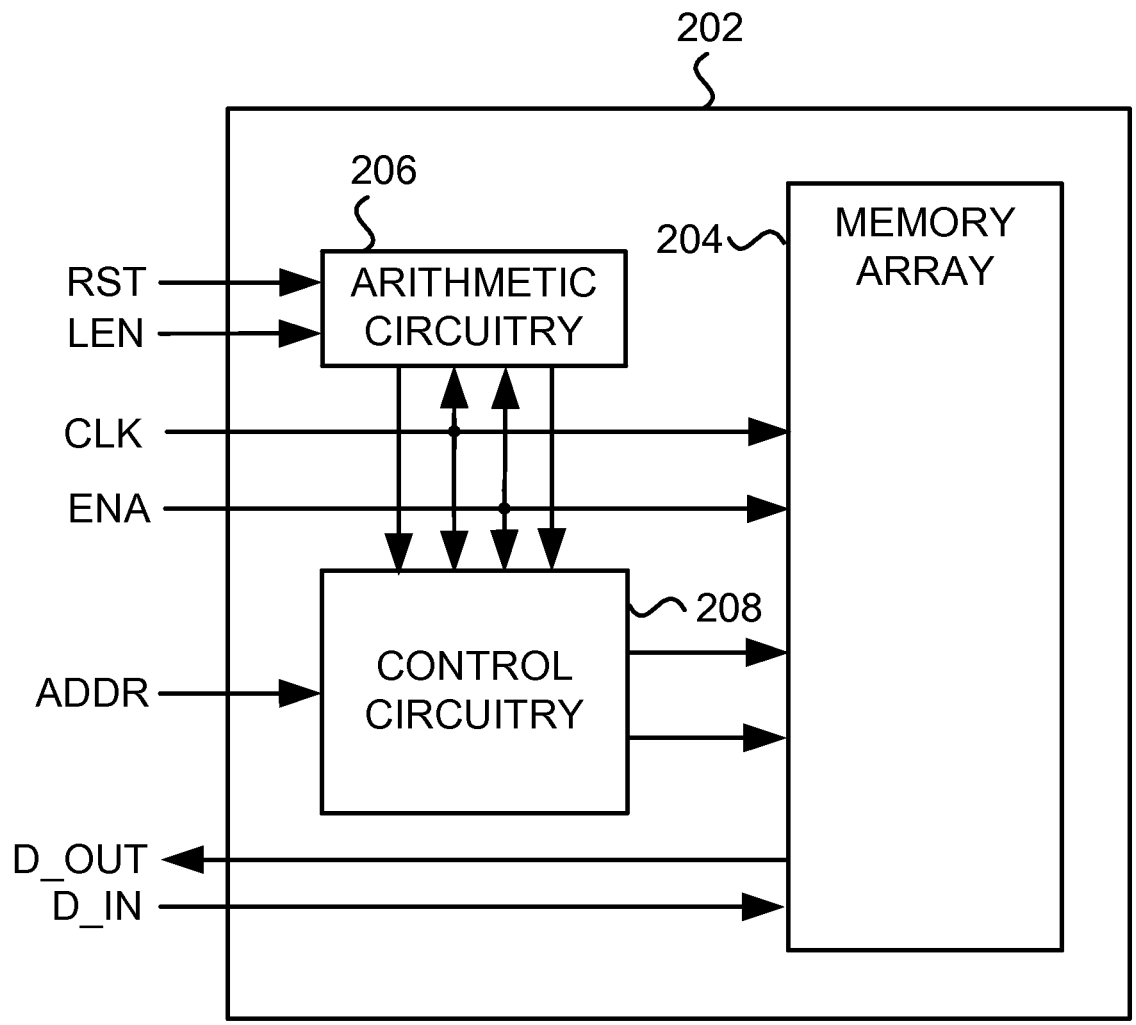
FIG. 2A is a diagram of an illustrative configurable storage block with a memory array, arithmetic circuitry, and a control circuit in accordance with an embodiment.

At least a portion of storage circuitry 130 or logic array blocks 110 may include configurable storage blocks with added functionality to implement FIFOs, shift registers, and delay-line modules efficiently. FIG. 2A shows an embodiment of a configurable storage block 202 that may be operated in random-access mode (i.e., as a RAM), in FIFO mode (i.e., as a FIFO circuit), in shift register mode (i.e., as a shift register), or in delay-line mode (i.e., as a delay-line module).

As shown, configurable storage block 202 may include memory array 204, arithmetic circuitry 206, and control circuitry 208. Data may be written to memory array 204 through data-in port D_IN and read from memory array 204 through data-out port D_OUT of configurable storage block 202. The write operation and the read operation may be synchronized to a clock signal that configurable storage block 202 may receive at clock port CLK. If desired, the write and read operations may be synchronized to different clocks (e.g., a write clock and a read clock) that may be part of separate clock domains.

Configurable storage block 202 may receive an enable signal at enable port ENA. As shown, the enable signal may enable the read and write operations on memory array 204 and operations of arithmetic circuitry 206 and control circuitry 208. If desired, the write and read operations may be enabled by different enable signals (e.g., a write enable and a read enable).

Memory array 204 may include an inbound pipeline for incoming data between port D_IN and memory array 204 (not shown), an outbound pipeline for outgoing data between memory array 204 and port D_OUT (not shown), and an optional bypass selector circuit for "fall-through" in FIFO mode (not shown) in which data is written into the last free location of the FIFO and thus data is available on the D_OUT output as soon as the same data enters the memory array on the D_IN input.

As shown, arithmetic circuitry 206 may receive a reset signal from port RST and a length signal from port LEN of configurable storage block 202 in addition to the enable signal from port ENA and the clock signal from port CLK. If desired, arithmetic circuitry 206 may generate read and write address signals based on the received signals. For example, arithmetic circuitry 206 may generate an initial write address signal for storing data at a write location of memory array 204 upon receipt of a reset signal. At a clocking event (e.g., at a rising clock edge or at a falling clock edge, or at both rising and falling clock edges) and based on the enable signal, arithmetic circuitry 206 may increase the write address signal by one location in the memory array 204. Thus, two successive write operations are addressing the memory array in a predetermined sequence at two adjacent storage locations.

Similarly, arithmetic circuit 206 may generate a read address signal for retrieving data from a read location of memory array 204. For example, at a clocking event and based on the enable signal, arithmetic circuit 206 may generate the read address signal. If desired, the read address signal may be generated based on a subtraction of the length signal LEN from the write address signal.

For example, the write address signal may be N and the read address signal N−LEN+1. Thereby, arithmetic circuitry 206 may generate address signals that point to read and write address locations that are a fixed number of locations apart, thereby implementing a shift register or a delay-line module of fixed length LEN.

At a clocking event (e.g., at a rising clock edge or at a falling clock edge, or at both rising and falling clock edges) and based on the enable signal, arithmetic circuitry 206 may increase the read address signal by one location in the memory array 204. In the example above, the write address signal may now be N+1 and the read address signal N−LEN+2. Thus, two successive read operations are addressing the memory array in a predetermined sequence at two adjacent storage locations. Arithmetic circuitry 206 may send the generated address signals to control circuitry 208.

Control circuitry 208 may receive the generated address signals from arithmetic circuitry 206 and an address signal from port ADDR in addition to the enable signal from port ENA and the clock signal from port CLK. If desired, the address signal may include different signals for the write and read operations (i.e., a read address signal and a write address signal).

Control circuitry 208 may select between operating the configurable storage block 202 in a first mode and operating the configurable storage block 202 in a second mode. As an example, control circuitry 208 may select the address signal from port ADDR for accessing memory array 204 for write and read operations, thereby operating configurable storage block 202 as a random-access memory in the first mode. In the second mode, control circuitry 208 may select the generated address signals from arithmetic circuitry 206 for accessing memory array 204 for write and read operations, thereby operating configurable storage block 202 as a shift register, a first-in first-out circuit (FIFO), or a delay-line module (DLM).

If desired, control circuitry 208 may include address registers and store the selected address signal in these address registers to provide for synchronous write and/or read operations. Control circuitry 208 may use the enable signal from port ENA to enable storage of the selected address signals in the address registers.

Figure 2B:
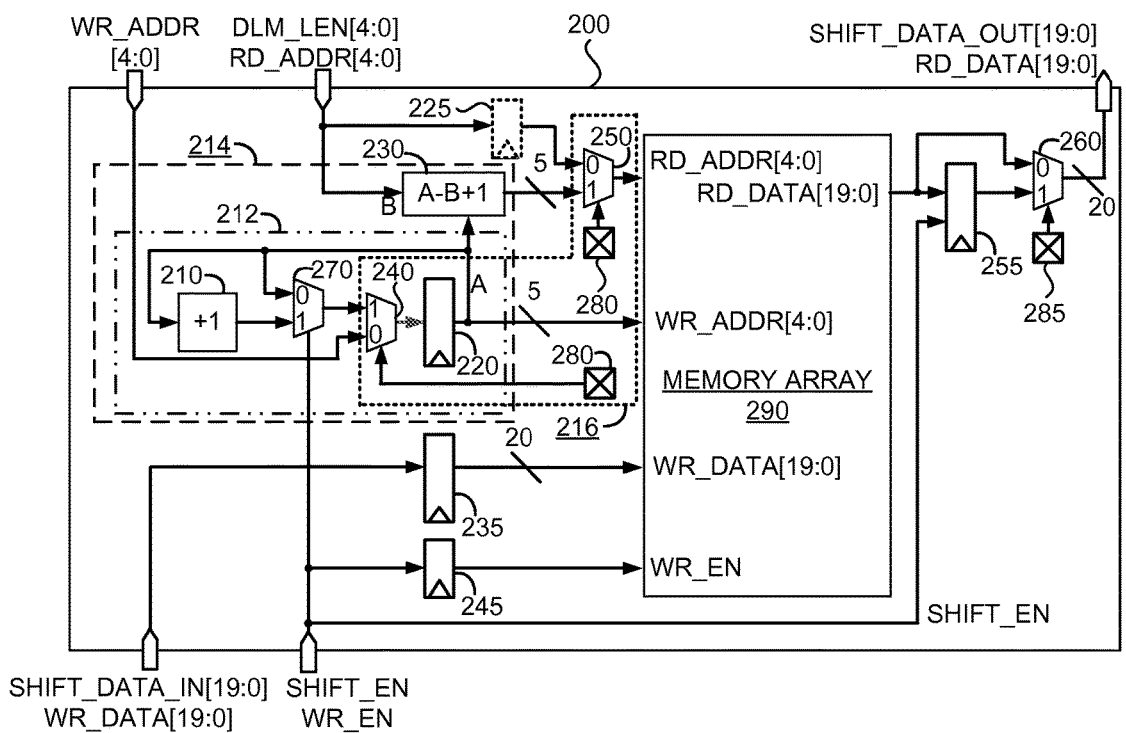
FIG. 2B is a diagram of an illustrative configurable storage block with arithmetic and control circuitry for accessing the memory array in first-in first-out (FIFO), delay-line, or random-access memory (RAM) mode in accordance with an embodiment.

FIG. 2B shows another embodiment of a configurable storage block. Configurable storage block 200 may be operated in random-access memory mode (i.e., as a RAM), in FIFO mode (i.e., as a FIFO circuit), in shift register mode (i.e., as a shift register), or in delay-line mode (i.e., as a delay-line module).

Configurable storage block 200 which includes an interface and a simple dual-port memory array is merely illustrative and is not intended to limit the scope of the present invention. If desired, configurable storage block may include an interface and a memory array with a different port configuration such as a true dual-port memory array, a quad-port memory array, etc.

When operated in random-access mode, such a configurable storage block which may include a true-dual port memory array (not shown) may be configured to operate as a single-port RAM (i.e., the read and write operations share the same address and read and write operations occur on the same port), a simple dual-port RAM (i.e., write and read operations use different ports and have dedicated addresses), a true dual-port RAM (i.e., write and read operations are available on both ports), a single-port ROM (i.e., a single-port RAM with a disabled write operation), or a dual-port ROM (i.e., a true dual-port RAM with disabled read operations on both ports).

As shown, configurable storage block 200 may include memory array 290, arithmetic circuit 214, control circuit 216, registers 225, 235, 245, and 255, and multiplexer 260, which may be controlled by programmable memory element 285.

Control circuit 216 may include register 220 and multiplexers 240 and 250, which are controlled by programmable memory element 280. Arithmetic circuit 214 may include subtractor 230 to compute a read address and a counter 212 to compute a write address. If desired, subtractor 230 may implement a modulo N subtraction, which wraps around to (N−1) upon reaching '0'. As an example, subtracting '3' from '1' modulo '8' is '6' (i.e., (1−3) mod 8=6). Counter 212 may include increment element 210, register 220, multiplexer 270, which may be controlled by an enable signal, and multiplexer 240 which may be controlled by programmable memory element 280.

Alternatively, arithmetic circuit 214 may include an adder instead of subtractor 230 to compute the read address and a decrement element instead of increment element 210 to compute the write address.

Control circuit 216 may operate configurable storage block 200 in random-access mode when programmable memory element 280 is storing '0' and in shift register mode, FIFO mode, or delay-line mode when programmable memory element 280 is storing '1'. If desired, programmable memory element 280 may be omitted and configurable storage block 200 may have an additional port (e.g., port MODE_SEL, not shown) coupled to the control port of multiplexers 240 and 250, thereby providing the option to dynamically switch between operating configurable storage block 200 in random-access mode (e.g., by sending a signal of value '0' to port MODE_SEL) and operating configurable storage block 200 in FIFO mode, shift register mode, or delay-line mode (e.g., by sending a signal of value '1' to port MODE_SEL).

As shown, control circuit 216 and arithmetic circuit 214 may share register 220. In this configuration, multiplexer 240 may select between the signals received from port WR_ADDR and multiplexer 270 and send the selected signal to register 220. If desired, register 220 may be duplicated into first and second registers. Multiplexer 270 may drive the first register and port WR_ADDR may drive the second register (not shown). In this configuration, multiplexer 240 may receive signals from the first and second registers, select between the received signals based on programmable memory element 280, and send the selected signal to port WR_ADDR of memory array 290.

The configuration with first and second registers instead of shared register 220 may enable the separation of arithmetic circuit and control circuit by including the first register into the arithmetic circuit and multiplexer 240 into the control circuit. The second register may be placed between port WR_ADDR and the control circuit similar to register 225, which is placed between port RD_ADDR and control circuit 216.

Configurable storage block 200 and thus memory array 290 may have a predetermined width and depth. For example, configurable storage block and thus memory array 290 may have width W and depth D. If desired, configurable storage block 200 may be configured to have a different width and depth.

As an example, consider the scenario in which configurable storage block 200 is configured to be 20 bits wide and 32 bits deep. Thus, data input port such as SHIFT_DATA_IN/WR_DATA and data output port such as SHIFT_DATA_OUT/RD_DATA may be 20 bits wide, while read address port DLM_LEN/RD_ADDR and write address port WR_ADDR may be five bits wide.

Enable port SHIFT_EN/WR_EN may be one bit wide to receive a write enable signal or a shift enable signal based on whether control circuit 216 operates configurable storage block 200 in random-access memory mode, or in FIFO mode, in DLM mode, or in shift register mode. As shown, the write enable signal or the shift enable signal may control the write operations on memory array 290, the increment operations of arithmetic circuit 214, and the write operation to register 255.

If desired, configurable storage block 200 may include an additional enable port (not shown) for receiving a read enable signal, which may control register 255 and the read operation of memory array 290. In such a scenario, the shift enable signal may be coupled to both, enable port SHIFT_EN/WR_EN and the read enable port.

The write operation and the read operation executed on configurable storage block 200 may be synchronized to a clock signal that configurable storage block 200 may receive at a clock port (not shown). If desired, the write and read operations may be synchronized to different clocks (e.g., a write clock and a read clock) that may be part of separate clock domains. In this scenario, the write and read operations may be enabled by the shift enable signal from the enable port SHIFT_EN/WR_EN and a read enable signal from the read enable port, respectively.

Registers 220 and 245 may provide for a synchronous write operation to memory array 290. Register 220 may also ensure synchronous read operation from memory array 290 in FIFO mode, shift register mode, or delay-line mode. In random-access mode, optional register 225 may provide for a synchronous read operation from memory array 290, and the omission of register 225 may provide for asynchronous read access to storage locations in memory array 290.

Register 235 may provide an inbound pipeline for incoming data between port SHIFT_DATA_IN/WR_DATA and memory array 290. If desired, register 235 may be removed thereby removing the inbound pipeline for incoming data between port SHIFT_DATA_IN/WR_DATA and memory array 290.

Register 255 may provide an outbound pipeline for outgoing data between memory array 290 and port SHIFT_DATA_OUT/RD_DATA, which may be bypassed by selecting the bypass path between memory array 290 and port SHIFT_DATA_OUT/RD_DATA with multiplexer 260 based on programmable memory element 285.

Configurable storage block 200 may further have a reset or a preset port (not shown). A reset port may be one bit wide, and a reset signal received at the reset port may reset register 220 to an initial state. For example, the reset signal may set the contents of register 220 to '0' such that the output of register 220 points to write address '0'. A preset port may be five bits wide, and a preset signal received at the preset port may set register 220 to any arbitrary state such that the output of register 220 points to an arbitrary initial write address.

If desired, arithmetic circuit 214 may generate read and write address signals. For example, arithmetic circuit 214 may generate an initial write address signal for storing data at a write location of memory array 290 upon receipt of a reset signal. At a clocking event (e.g., at a rising clock edge or at a falling clock edge, or at both rising and falling clock edges) and based on the enable signal, counter 212 of arithmetic circuit 214 may increase the write address signal by one location in memory array 290. Thus, two successive write operations are addressing the memory array in a predetermined sequence at two adjacent storage locations.

Similarly, subtractor 230 of arithmetic circuit 214 may generate a read address signal for retrieving data from a read location of memory array 290. For example, at a clocking event and based on the enable signal, arithmetic circuit 206 may generate the read address signal based on a subtraction of the length signal (e.g., B) received at port DLM_LEN of configurable storage block 200 from the computed write address signal (e.g., A) plus one (i.e., A−B+1). If register 235 were removed, subtractor 230 may compute the read address signal based on the subtraction of the length signal received at port DLM_LEN of configurable storage block 200 from the computed write address (i.e., A−B). Thus, arithmetic circuit 214 may generate address signals that point to read and write address locations that are a fixed number of locations apart, thereby implementing a shift register or a delay-line module of fixed length LEN.

At a clocking event (e.g., at a rising clock edge or at a falling clock edge, or at both rising and falling clock edges) and based on the enable signal, arithmetic circuit 214 may increase the read address signal by one location in memory array 290. Thus, two successive read operations are addressing the memory array in a predetermined sequence at two adjacent storage locations. Arithmetic circuit 214 may send the generated address signals to control circuit 216.

Control circuit 216 may receive the generated address signals from arithmetic circuit 214, a write address signal from port WR_ADDR, and a read address signal from port RD_ADDR. Control circuit 216 may select between operating the configurable storage block 200 in a first mode and operating the configurable storage block 200 in a second mode. As an example, control circuit 216 may store '0' in programmable memory element 280, thereby selecting the address signals from ports WR_ADDR and RD_ADDR for accessing memory array 290 for write and read operations and operating configurable storage block 200 as a random-access memory in the first mode.

In the second mode, control circuit 216 may store '1' in programmable memory element 280 and thus select the generated address signals from arithmetic circuit 214 for accessing memory array 290 for write and read operations, thereby operating configurable storage block 200 in shift register mode, first-in first-out circuit (FIFO) mode, or a delay-line mode.

As an example, consider the scenario in which register 220 initially stores '0'. Consider further that arithmetic circuit 214 receives a length signal '3' from port DLM_LEN of configurable storage block 200, that programmable memory element 285 stores '0' (i.e., register 255 is bypassed), and that programmable memory element 280 stores '1' (i.e., control circuit 216 operates configurable storage block 200 in FIFO mode, shift register mode, or delay-line mode).

In this scenario, configurable storage block operates as illustrated in TABLE 1.

Columns entitled SHIFT_EN, SHIFT_DATA_IN, and SHIFT_DATA_OUT of TABLE 1 show the values of the signals at ports SHIFT_EN, SHIFT_DATA_IN, and SHIFT_DATA_OUT of configurable storage block 200, respectively. Columns entitled 245, 235, and 220 of TABLE 1 show the values of the signals stored in registers 245, 235, and 220, respectively. The column entitled RD_ADDR of TABLE 1 shows the value of the signal at port RD_ADDR of memory array 290, and the remaining columns (i.e., columns under MEMORY ARRAY LOCATIONS) show the values of the signals stored in memory array 290 at addresses 0 to 6. The values of the signals stored in memory array 290 at addresses 7 to 31 may be set to "don't care" for the purpose of this example.

Every row of TABLE 1 with the exception of the header row may show a change in values at the respective ports, registers, and the memory array in response to a clocking event (e.g., a rising or falling clock edge). This is illustrated by the column entitled STATE with entries T0, T1, etc., which each represent a stable state after a clocking event, which has triggered synchronous elements (i.e., memory array 290 and registers 220, 225, 235, 245, and 255) in configurable storage block 200.

For example, in state T0, port SHIFT_EN may receive '0' and port SHIFT_DATA_IN may receive 'D0', registers 220 and 245 may be reset to store '0' and the input to port RD_ADDR of memory array 290 may be 30 as computed by subtractor 230 (i.e., (0−3+1) mod 32=30).

After the clocking event that moves the system to state T1, register 245 may store '0', the value of the signal received at port SHIFT_EN in state T0; register 220 may store '0', the value selected by multiplexer 270 and received from register 220; and register 235 may store 'D0', the value of the signal received at port SHIFT_DATA_IN in state T0. In state T1, port SHIFT_EN may receive '1' and port SHIFT_DATA_IN may receive 'D1'. As a result, the input to port RD_ADDR of memory array 290 may remain 30.

After the clocking event that moves the system to state T2, register 245 may store '1', the value of the signal received at port SHIFT_EN in state T1; register 220 may store '1', the value computed by the multiplexer 270 and increment element 210; and register 235 may store 'D1', the value of the signal received at port SHIFT_DATA_IN in state T1. 'D0' may not be stored in memory array 290, because the write access was not enabled at T1 (i.e., register 245 stored '0'). In state T2, port SHIFT_EN may receive '1', and port

TABLE 1

Operating the configurable storage block in FIFO mode, shift register mode, or delay-line mode

| STATE | SHIFT_EN | SHIFT_DATA_IN | 245 | 235 | 220 | RD_ADDR | SHIFT_DATA_OUT | MEMORY ARRAY LOCATION ||||||| 
|---|---|---|---|---|---|---|---|---|---|---|---|---|---|---|
|  |  |  |  |  |  |  |  | 0 | 1 | 2 | 3 | 4 | 5 | 6 |
| T0 | 0 | D0 | 0 | — | 0 | 30 | — | — | — | — | — | — | — | — |
| T1 | 1 | D1 | 0 | D0 | 0 | 30 | — | — | — | — | — | — | — | — |
| T2 | 1 | D2 | 1 | D1 | 1 | 31 | — | — | — | — | — | — | — | — |
| T3 | 1 | D3 | 1 | D2 | 2 | 0 | — | — | D1 | — | — | — | — | — |
| T4 | 1 | D4 | 1 | D3 | 3 | 1 | D1 | — | D1 | D2 | — | — | — | — |
| T5 | 1 | D5 | 1 | D4 | 4 | 2 | D2 | — | D1 | D2 | D3 | — | — | — |
| T6 | 1 | D6 | 1 | D5 | 5 | 3 | D3 | — | D1 | D2 | D3 | D4 | — | — |
| T7 | 0 | D7 | 1 | D6 | 6 | 4 | D4 | — | D1 | D2 | D3 | D4 | D5 | — |
| T8 | 0 | D8 | 0 | D7 | 6 | 4 | D4 | — | D1 | D2 | D3 | D4 | D5 | D6 |
| T9 | 1 | D9 | 0 | D8 | 6 | 4 | D4 | — | D1 | D2 | D3 | D4 | D5 | D6 |

SHIFT_DATA_IN may receive 'D2'. As a result, the input to port RD_ADDR of memory array 290 may increase to 31.

After the clocking event that moves the system to state T3, register 245 may store '1', the value of the signal received at port SHIFT_EN in state T2; register 220 may store '2', the value computed by increment element 210 which added '1' to the '1' received from register 220; and register 235 may store 'D2', the value of the signal received at port SHIFT_DATA_IN in state T2. 'D1' may be stored in memory array 290 at location '1', because register 220 stored '1' at T2 and the write access is enabled at T2 (i.e., register 245 stored '1'). In state T3 port SHIFT_EN may receive '1' and port SHIFT_DATA_IN may receive 'D3'. As a result, the input to port RD_ADDR of memory array 290 may increase to 0 and the content of memory array 290 at address '0' (i.e., "don't care") is sent to port SHIFT_DATA_OUT.

After the clocking event that moves the system to state T4, register 245 may store '1', the value of the signal received at port SHIFT_EN in state T3; register 220 may store '3', the value computed by increment element 210 which added '1' to the '2' received from register 220; and register 235 may store 'D3', the value of the signal received at port SHIFT_DATA_IN in state T3. 'D2' may be stored in memory array 290 at location '2', because register 220 stored '2' at T3 and the write access is enabled at T3 (i.e., register 245 stored '1'). In state T4 port SHIFT_EN may receive '1' and port SHIFT_DATA_IN may receive 'D4'. As a result, the input to port RD_ADDR of memory array 290 may increase to 1 and the content of memory array 290 at address '1' (i.e., 'D1') is sent to port SHIFT_DATA_OUT.

After the clocking event that moves the system to state T5, register 245 may store '1', the value of the signal received at port SHIFT_EN in state T4; register 220 may store '4', the value computed by increment element 210 which added '1' to the '3' received from register 220; and register 235 may store 'D4', the value of the signal received at port SHIFT_DATA_IN in state T4. 'D3' may be stored in memory array 290 at location '3', because register 220 stored '3' at T4 and the write access is enabled at T4 (i.e., register 245 stored '1'). In state T5 port SHIFT_EN may receive '1' and port SHIFT_DATA_IN may receive 'D5'. As a result, the input to port RD_ADDR of memory array 290 may increase to 2 and the content of memory array 290 at address '2' (i.e., 'D2') is sent to port SHIFT_DATA_OUT.

After the clocking event that moves the system to state T6, register 245 may store '1', the value of the signal received at port SHIFT_EN in state T5; register 220 may store '5', the value computed by increment element 210 which added '1' to the '4' received from register 220; and register 235 may store 'D5', the value of the signal received at port SHIFT_DATA_IN in state T5. 'D4' may be stored in memory array 290 at location '4', because register 220 stored '4' at T5 and the write access is enabled at T5 (i.e., register 245 stored '1'). In state T6 port SHIFT_EN may receive '1' and port SHIFT_DATA_IN may receive 'D6'. As a result, the input to port RD_ADDR of memory array 290 may increase to 3 and the content of memory array 290 at address '3' (i.e., 'D3') is sent to port SHIFT_DATA_OUT.

After the clocking event that moves the system to state T7, register 245 may store '1', the value of the signal received at port SHIFT_EN in state T6; register 220 may store '6', the value computed by increment element 210 which added '1' to the '5' received from register 220; and register 235 may store 'D6', the value of the signal received at port SHIFT_DATA_IN in state T6. 'D5' may be stored in memory array 290 at location '5', because register 220 stored '5' at T6 and the write access is enabled at T6 (i.e., register 245 stored '1'). In state T7 port SHIFT_EN may receive '0' and port SHIFT_DATA_IN may receive 'D7'. As a result, the input to port RD_ADDR of memory array 290 may increase to 4 and the content of memory array 290 at address '4' (i.e., 'D4') is sent to port SHIFT_DATA_OUT.

After the clocking event that moves the system to state T8, register 245 may store '0', the value of the signal received at port SHIFT_EN in state T7; register 220 may store '6', the value selected by multiplexer 270 and received from register 220; and register 235 may store 'D7', the value of the signal received at port SHIFT_DATA_IN in state T7. 'D6' may be stored in memory array 290 at location '6', because register 220 stored '6' at T7 and the write access is enabled at T7 (i.e., register 245 stored '1'). In state T8 port SHIFT_EN may receive '0' and port SHIFT_DATA_IN may receive 'D8'. As a result, the input to port RD_ADDR of memory array 290 may remain at 4 and the content of memory array 290 at address '4' (i.e., 'D4') is sent to port SHIFT_DATA_OUT.

After the clocking event that moves the system to state T9, register 245 may store '0', the value of the signal received at port SHIFT_EN in state T8; register 220 may store '6', the value selected by multiplexer 270 and received from register 220; and register 235 may store 'D8', the value of the signal received at port SHIFT_DATA_IN in state T8. 'D7' may not be stored in memory array 290 at location '7', because register 220 stored '7' at T8, but the write access is disabled at T8 (i.e., register 245 stored '0'). In state T9 port SHIFT_EN may receive '1' and port SHIFT_DATA_IN may receive 'D9'. As a result, the input to port RD_ADDR of memory array 290 may remain at 4 and the content of memory array 290 at address '4' (i.e., 'D4') is sent to port SHIFT_DATA_OUT.

Figure 3:
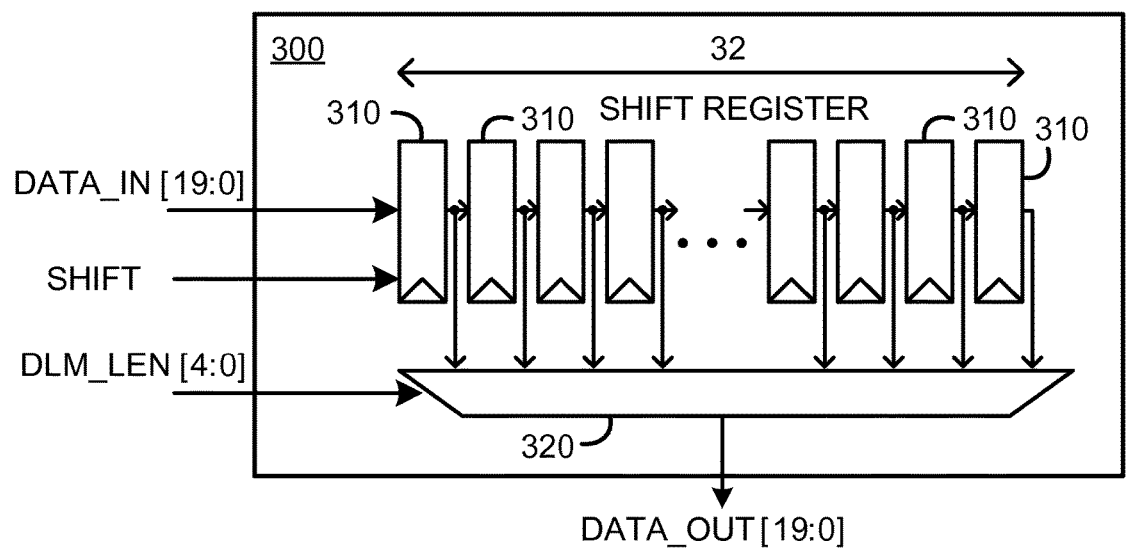
FIG. 3 is a diagram of an illustrative behavioral representation of the configurable storage block of FIG. 2B in variable-length shift register mode in accordance with an embodiment.

As illustrated in the example of TABLE 1, control circuit 216 may configure configurable storage block 200 in shift register mode. FIG. 3 is a diagram of an illustrative behavioral representation of a shift register 300 that shows the behavior of the configurable storage block 200 of FIG. 2B configured in shift register mode. As shown, shift register 300 may include 32 register banks 310, each having 20 registers to receive the 20 bits of signal DATA_IN. Shift register 300 may also include multiplexer block 320, which may include 20 32:1 multiplexer, each selecting one bit of signal DATA_OUT.

Signal SHIFT may enable the write operation to the registers of register banks 310 and signal DLM_LEN may determine the length of shift register 300 by controlling the selection in multiplexer block 320. For example, signal DLM_LEN may be '0', which may direct multiplexer 320 to select the output of the left-most register bank 310.

Figure 4:
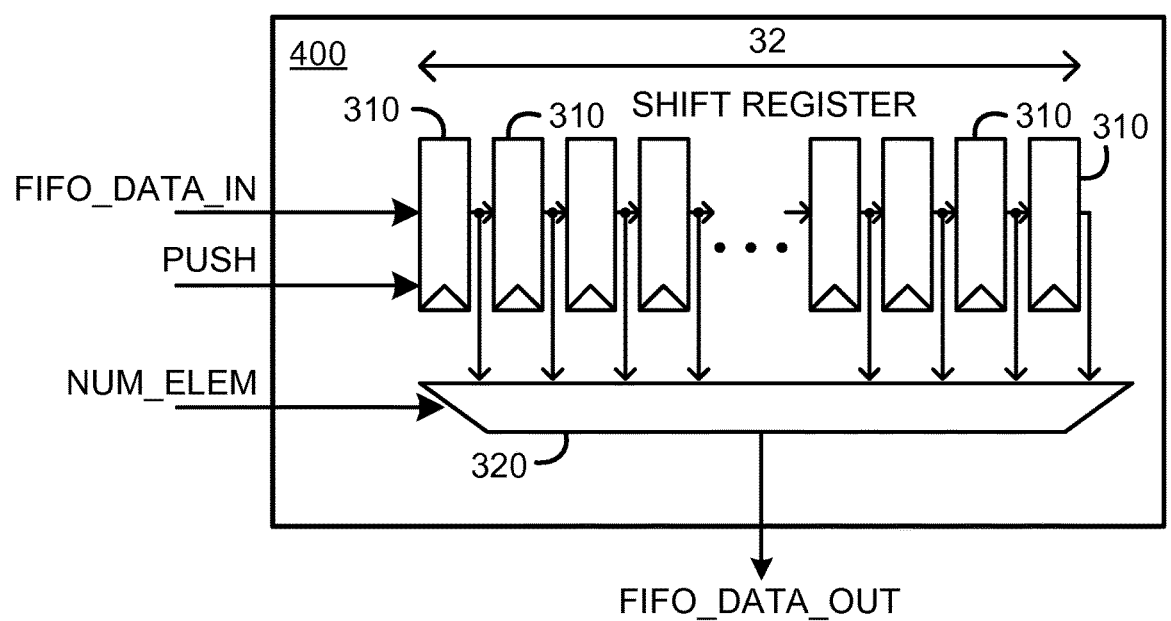
FIG. 4 is a diagram of an illustrative behavioral representation of the configurable storage block of FIG. 2B in variable-length FIFO mode in accordance with an embodiment.

As another example, control circuit 216 may configure configurable storage block 200 in first-in first-out (FIFO) mode. FIG. 4 is a diagram of an illustrative behavioral representation of a first-in first-out (FIFO) circuit 400 that shows the behavior of the configurable storage block 200 of FIG. 2B configured in FIFO mode. As shown, FIFO circuit 400 may include 32 register banks 310, each having 20 registers to receive the 20 bits of signal FIFO_DATA_IN. FIFO circuit 400 may also include multiplexer block 320, which may include 20 32:1 multiplexer, each selecting one bit of signal FIFO_DATA_OUT.

Signal PUSH may enable the write operation to the registers of register banks 310 and signal NUM_ELEM may determine the depth of FIFO circuit 400, thereby controlling the selection in multiplexer block 320. For example, signal NUM_ELEM may be '0', which may direct multiplexer 320 to select the output of the left-most register bank 310.

During a write operation to FIFO circuit 400, a write counter (e.g., a counter outside of FIFO circuit 400) may increment the write address location and signal NUM_ELEM. During a read operation, a backward counter may decrement signal NUM_ELEM. In the event that a read and a write operation are performed at the same time, then the write address location is incremented while signal NUM_ELEM remains unchanged. If desired, FIFO circuit 400 may generate status signals such as FULL, ALMOST_FULL, HALF_FULL, ALMOST_EMPTY, and EMPTY based on a comparison of signal NUM_ELEM with the depth of the FIFO circuit.

A FULL signal may indicate that FIFO circuit 400 is in a state in which all of the addressable space is used and an additional write operation may lead to an overflow of the FIFO circuit. As a result, signal PUSH may disable any write operation for as long as the shift register is full. In response to receiving a FULL signal, a user may enable an overflow protection circuit. As an example, an overflow protection circuit may apply back-pressure (i.e., sending a request to the producer of the FIFO_DATA_IN to stall the production and/or the transmission of that FIFO_DATA_IN). An overflow protection circuit may also discard any data that the FIFO circuit receives while the FULL signal is asserted.

An EMPTY signal may indicate that the shift register doesn't contain any data that hasn't been retrieved already and an additional read operation may lead to an underflow of the FIFO. As a result, a PULL signal (not shown) may disable any read operation for as long as the shift register is empty. In response to receiving an EMPTY signal, a user may enable an underflow protection circuit. As an example, an underflow protection circuit may prevent the consumer of the FIFO_DATA_OUT from making read requests to the FIFO. An underflow protection circuit may also provide predetermined data that the consumer of the FIFO data knows is invalid.

An ALMOST_FULL signal may serve as an early indicator of the FULL signal. Similarly, an ALMOST_EMPTY signal may serve as an early indicator of the EMPTY signal. A HALF_FULL signal may indicate that the FIFO circuit is exactly half full.

Access to the register banks 310 may be synchronized to a clock signal. If desired, the register banks may be synchronized to two different clock signals (not shown). For example, each individual register banks 310 may select between a first and a second clock signal that may be part of separate clock domains. Synchronizing a first portion of the register banks 310 to the first clock signal and a second portion of the register banks 310 to the second clock signal may enable the use of FIFO circuit 400 as an elastic FIFO that interfaces between circuits that operate in different clock domains.

As mentioned above, configurable storage block 200 and thus memory array 290 may have a predetermined width and depth. In the example of FIG. 2B, configurable storage block 200 and thus memory array 290 may have width 20 and depth 32. Thus, configurable storage block 200 may implement any shift register, FIFO circuit, or delay-line module, which is up to 20 bits wide and up to 32 bits deep.

However, configurable storage block 200 may also implement shift registers or delay-line modules that are less than 20 bits wide but deeper than 32 bits by recirculating data through the configurable storage block. As an example, configurable storage block 200 with memory block 290 that is 20 bits wide and 32 bits deep may implement shift registers or delay-line modules that are up to 64 bits deep and up to 10 bits wide (64×10), up to 128 bits deep and up to five bits wide (128×5), up to 160 bits deep and up to four bits wide (160×4), up to 320 bits deep and up to two bits wide (320×2), and up to 640 bits deep and one bit wide (640×1).

Figure 5:
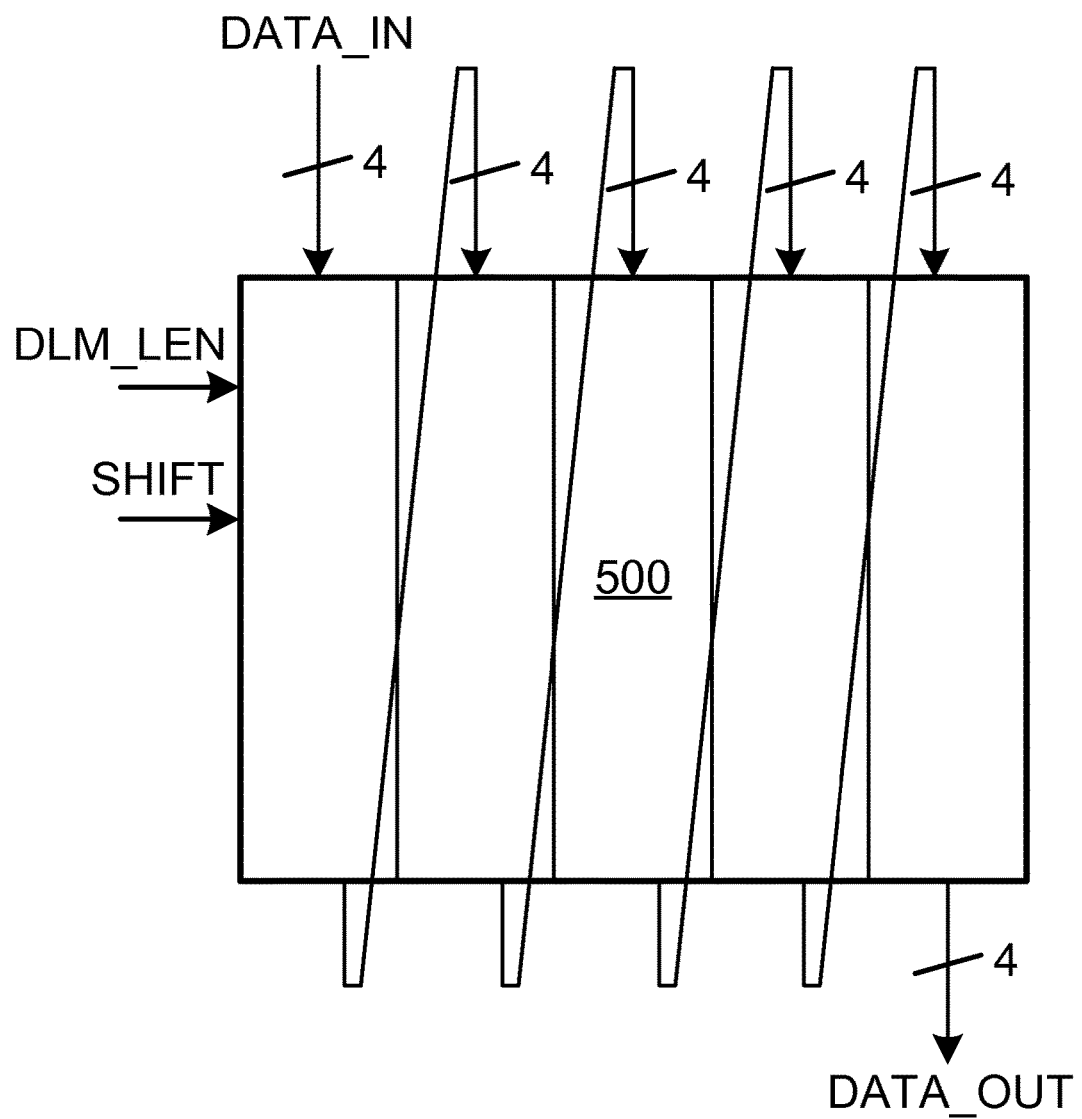
FIG. 5 is a diagram of an illustrative configurable storage block used as a narrow, long shift register in accordance with an embodiment.

FIG. 5 shows an embodiment of configurable storage block 500 that implements a shift register that is up to 160 bits deep and up to four bits wide (160×4) using for example configurable storage block 200 of FIG. 2B. For this purpose, signal DATA_IN may be coupled to port SHIFT_DATA_IN [3:0] of configurable storage block 200, port SHIFT_DATA_OUT[3:0] of configurable storage block 200 may be coupled to port SHIFT_DATA_IN[7:4], port SHIFT_DATA_OUT[7:4] to port SHIFT_DATA_IN[11:8], port SHIFT_DATA_OUT[11:8] to port SHIFT_DATA_IN[15:12], port SHIFT_DATA_OUT[15:12] to port SHIFT_DATA_IN[19:16], and port SHIFT_DATA_OUT[19:16] may provide DATA_OUT.

As an example, configurable storage block 500 may implement a shift register that is 150 bits deep and 4 bits wide. In this example, DLM_LEN may be chosen to be 30 such that configurable storage block 500 implements five shift registers that are each 30 bits deep and 4 bits wide, thereby forming a 150 bit deep shift register by recirculating the data as shown in FIG. 5.

As shown, configurable storage block 500 may be tapped (i.e., the shift register contents may be used by other circuitry) every DLM_LEN bits (i.e. every time the shift register contents is recirculated). In the example of a 150-bit deep and 4-bit wide shift register, the shift register contents may be tapped every 30 bits. In other words, bits 30, 60, 90, and 120 may be tapped in addition to the input and output data.

Configurable storage block 500 may implement shift registers or delay-line modules with depths that are based on the number of times that the data is recirculated. For example, configurable storage block 500 may implement a shift register or delay-line module with a depth that is a multiple of two, three, four, five, etc. if the data is recirculated once, twice, thrice, four times, etc., respectively.

As an example, configurable storage block 500 may implement a shift register that is 124 bits deep and four bits wide by using a 4-bit wide DATA_IN signal and a DLM_LEN signal of 24 resulting in five shift registers that are each 24 bits deep and four bits wide for a total of a 120-bit deep and 4-bit wide shift register. However, such a shift register requires additional resources (e.g., another configurable storage block 500) to implement the remaining 4-bit deep and 4-bit wide shift register.

Alternatively, configurable storage block 500 may use a 5-bit wide DATA_IN signal and a DLM_LEN signal of 31 resulting in four shift registers that are each 31 bits deep and five bits wide for a total of a 124-bit deep and 5-bit wide shift register.

Different shift registers or delay-line modules of the same length that share the same clock and control signals (e.g., the same enable signal SHIFT_EN, the same reset or preset signal, and the same setting for programmable memory element 285 of FIG. 2B) may be packed together into a same configurable storage block.

Figure 6:
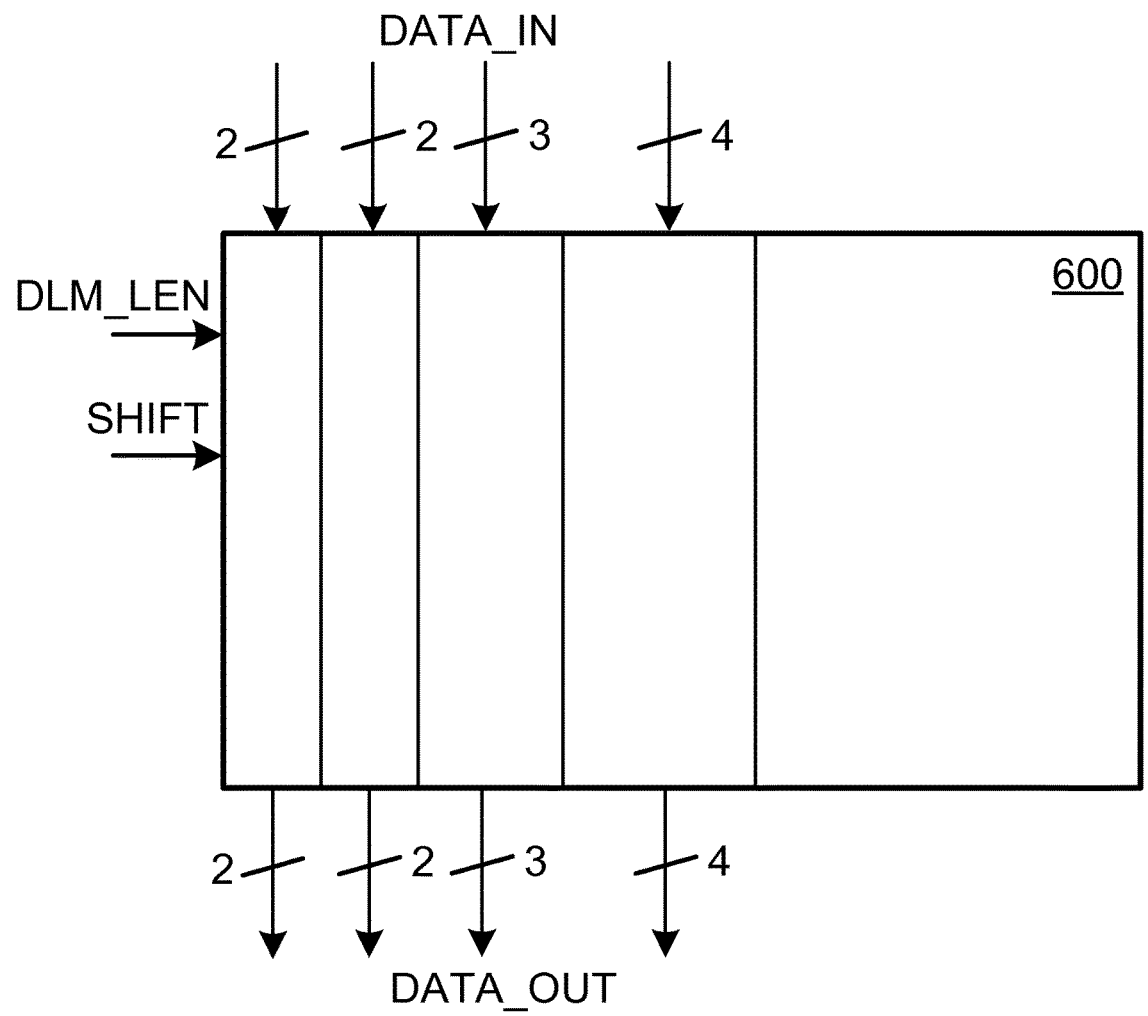
FIG. 6 is a diagram of an illustrative configurable storage block that implements multiple narrow shift registers in accordance with an embodiment.

FIG. 6 shows illustrative configurable storage block 600 that implements four shift registers that are respectively 2-bits, 2-bits, 3-bits, and 4-bits wide. These four shift registers share the same length DLM_LEN and the same enable signal SHIFT. As an example, the four shift registers may use input ports SHIFT_DATA_IN[1:0], SHIFT_DATA_IN[3:2], SHIFT_DATA_IN[6:4], and SHIFT_DATA_IN[10:7] and output ports SHIFT_DATA_OUT[1:0], SHIFT_DATA_OUT[3:2], SHIFT_DATA_OUT[6:4], and SHIFT_DATA_OUT[10:7] of configurable storage block 200 of FIG. 2B, respectively.

If desired, narrow shift registers as shown in FIG. 6 and deep shift registers as shown in FIG. 5 may be packed into a same configurable storage block if those shift registers have the same value for DLM_LEN and share the same clock and control signals (not shown).

Figure 7:
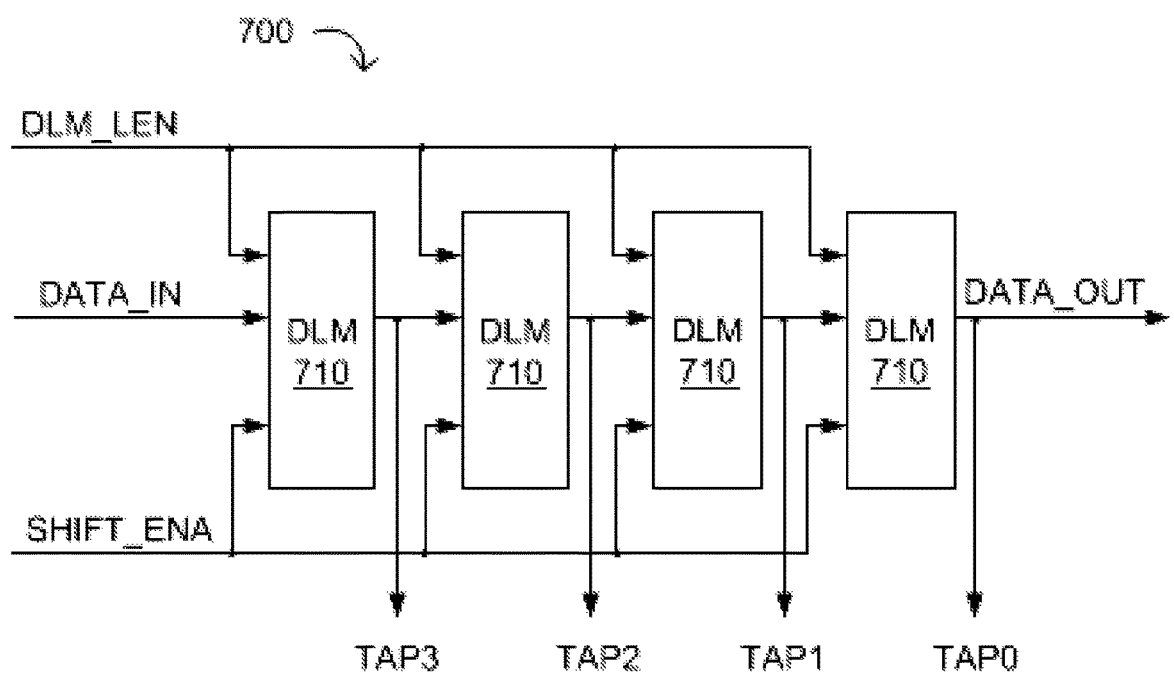
FIG. 7 is a diagram of illustrative configurable storage blocks that implement a delay-line module (DLM) with taps in accordance with an embodiment.

In another embodiment, several configurable storage blocks such as configurable storage block 200 of FIG. 2B may implement a tapped delay line. An example for a tapped delay line 700 is illustrated in FIG. 7. As shown, tapped delay line 700 may include four configurable storage blocks 710 that are arranged in a chain and configured as delay-line modules (DLM).

All four delay-line modules 710 may share the same length signal DLM_LEN and the same enable signal SHIFT_ ENA. If desired, some or all delay-line modules 710 may receive different length signals DLM_LEN. The first delay-line module in the chain receives signal DATA_IN and the last delay-line-module in the chain provides signal DATA_OUT. All four delay-line modules 710 may provide a tap signal. The first, second, third, and fourth delay-line modules provide signals TAP3, TAP2, TAP1, and TAP0, respectively.

If desired, additional control circuitry may operate tapped delay line 700 as a folded tapped delay line. For this purpose, the additional control circuitry may control signals DLM_LEN and SHIFT_ENA. For example, the additional control circuit may disable shifting using SHIFT_ENA, vary signal DLM_LEN from (N−1) to 0 with N being the number of registers in each DLM, thereby cycling through the values stored in each DLM 710 and provide the respective contents as signals TAP3, TAP2, TAP1, and TAP0, respectively, enable shifting for one shift, disable shifting, cycle through the values stored in each DLM, etc.

As an example, consider that each DLM has four register banks and that signal DATA_IN receives integer numbers that increase at every clocking event and that start at 1. Consider further that the numbers 1 to 16 have been shifted into tapped delay line 700 (i.e., the first DLM stores 16, 15, 14, and 13, the second DLM 12, 11, 10, and 9, the third DLM 8, 7, 6, and 5, and the fourth DLM 4, 3, 2, and 1). In this scenario, the additional control circuit may disable shifting and cycle through each of the DLM 710, thereby providing at [TAP3, TAP2, TAP1, TAP0] the values [13, 9, 5, 1], followed by [14, 10, 6, 2], [15, 11, 7, 3], and [16, 12, 8, 4].

The additional control circuit may enable shifting and shift 17, 13, 9, and 5 into the first, second, third, and fourth DLM, respectively. The additional control circuit may disable shifting again and cycle through each of the DLM, thereby providing at [TAP3, TAP2, TAP1, TAP0] the values [14, 10, 6, 2], [15, 11, 7, 3], [16, 12, 8, 4], and [17, 13, 9, 5]. The additional control circuit may enable shifting again, etc.

Figure 8:
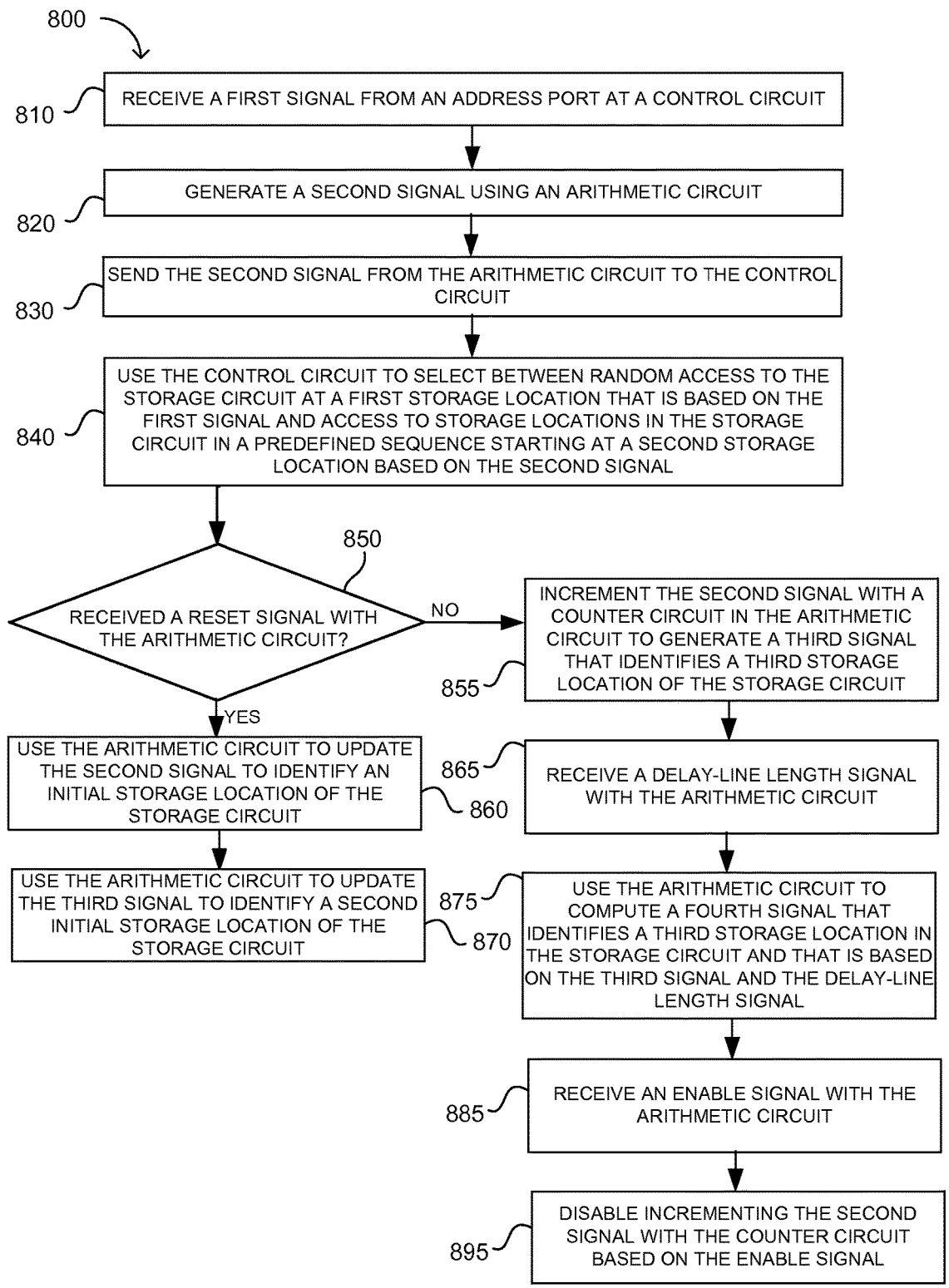
FIG. 8 is a flow chart showing illustrative steps for operating a configurable storage block in FIFO mode, delay-line mode, shift register mode, or RAM mode in accordance with an embodiment.

FIG. 8 is a flow chart showing illustrative steps for operating a configurable storage block such as configurable storage block 200 of FIG. 2B in FIFO mode, delay-line mode, shift register mode, or RAM mode in accordance with an embodiment.

During step 810, the configurable storage block may receive a first signal from an address port at a control circuit. During step 820, the configurable storage block may generate a second signal using an arithmetic circuit and send the second signal from the arithmetic circuit to the control circuit during step 830.

During step 840, the configurable storage block may use the control circuit to select between random access to the storage circuit at a first storage location that is based on the first signal and access to storage locations in the storage circuit in a predefined sequence starting at a second storage location based on the second signal.

During step 850, configurable storage block may verify whether the arithmetic circuit receives a reset signal. In response to confirming that the arithmetic circuit receives a reset signal, the configurable storage circuit may use the arithmetic circuit to update the second signal to identify an initial storage location of the storage circuit during step 860 and use the arithmetic circuit to update the third signal to identify a second initial storage location of the storage circuit during step 870.

In response to confirming that the arithmetic circuit does not receive a reset signal, the configurable storage block may increment the second signal with a counter circuit in the arithmetic circuit to generate a third signal that identifies a third storage location of the storage circuit during step 855. During step 865, the configurable storage block may receive a delay-line length signal with the arithmetic circuit and use the arithmetic circuit to compute a fourth signal that identifies a third storage location in the storage circuit and that is based on the third signal, and the delay-line length signal during step 875.

During step 885, the configurable storage block may receive an enable signal with the arithmetic circuit and disable incrementing the second signal with the counter circuit based on the enable signal.

Figure 9:
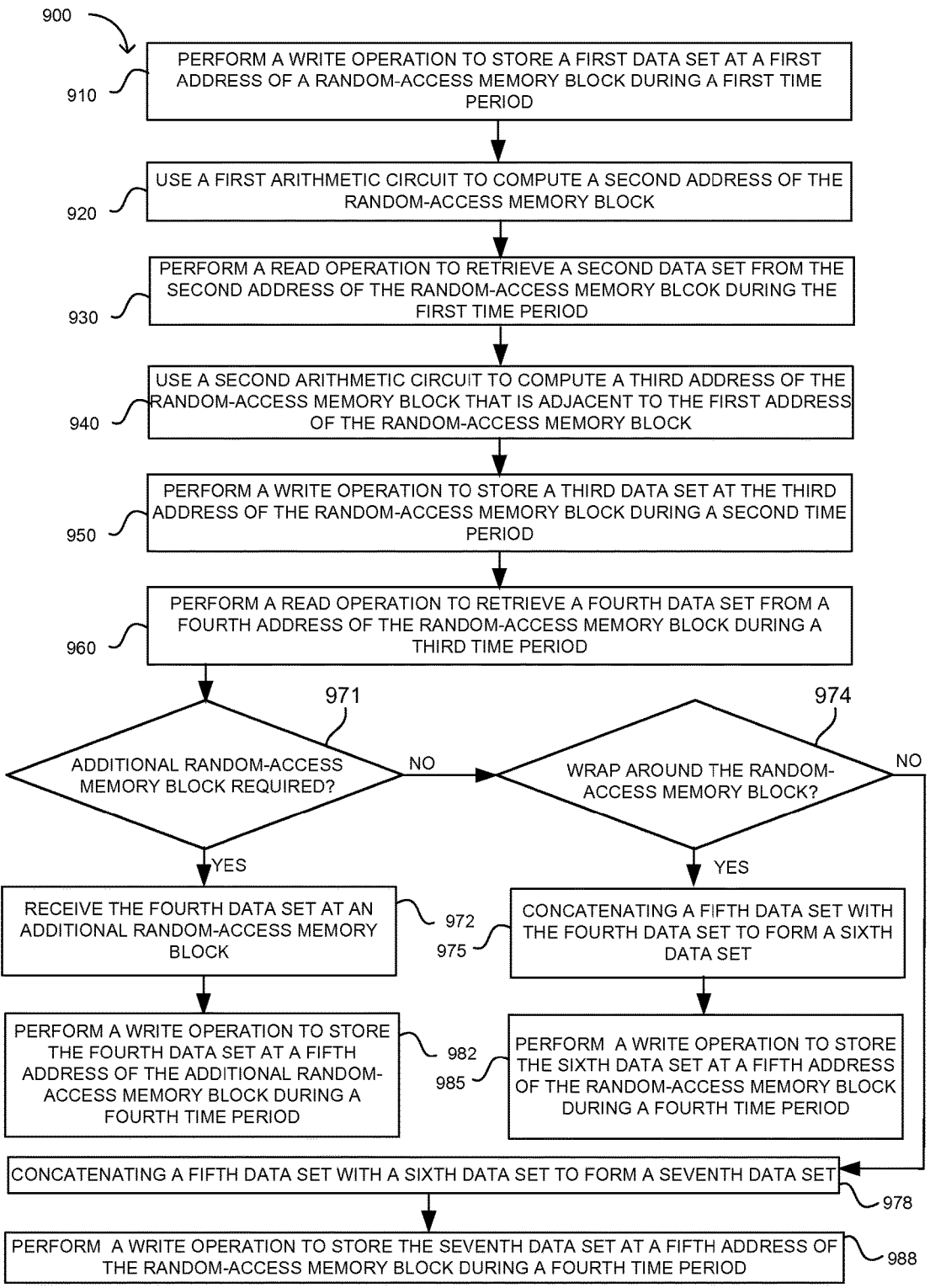
FIG. 9 is a flow chart showing illustrative steps for operating a configurable storage block as a narrow, long shift register, as multiple narrow shift registers, or as a tapped delay-line module in accordance with an embodiment.

FIG. 9 is a flow chart showing illustrative steps for operating a configurable storage block that includes a random-access memory block as a narrow, long shift register (e.g., configurable storage block 500 of FIG. 5), as multiple narrow shift registers (e.g., configurable storage block 600 of FIG. 6), or as a tapped delay-line module (e.g., tapped delay line 700 of FIG. 7) in accordance with an embodiment.

During step 910, the configurable storage block may perform a write operation to store a first data set at a first address of a random-access memory block during a first time period. During step 920, the configurable storage block may use a first arithmetic circuit (e.g., subtractor 230 of FIG. 2B) to compute a second address of the random-access memory block. During step 930, the configurable storage block may perform a read operation to retrieve a second data set from the second address of the random-access memory block during the first time period.

During step 940, the configurable storage block may use a second arithmetic circuit (e.g., counter 212 in arithmetic circuit 214 of FIG. 2B) to compute a third address of the random-access memory block that is adjacent to the first address of the random-access memory block. During step 950, the configurable storage block may perform a write operation to store a third data set at the third address of the random-access memory block during a second time period and a read operation to retrieve a fourth data set from a fourth address of the random-access memory block during a third time period.

During step 971, the configurable storage block may determine whether an additional random-access memory block is required. In response to determining that an additional random-access memory block is required, the configurable storage block may receive the fourth data set at an additional random-access memory block during step 972 and perform a write operation to store the fourth data set at a fifth address of the additional random-access memory block during a fourth time period.

In response to determining that an additional random-access memory block is not required, the configurable storage block may determine whether to wrap around the random-access memory block during step 974. In response to determining that wrapping around the random-access memory block is required, the configurable storage block may concatenate a fifth data set with the fourth data set to form a sixth data set during step 975 and perform a write operation to store the sixth data set at a fifth address of the random-access memory block during a fourth time period during step 985.

In response to determining that wrapping around the random-access memory block is not required, the configurable storage block may concatenate a fifth data set with a sixth data set to form a seventh data set during step 978 and perform a write operation to store the seventh data set at a fifth address of the random-access memory block during a fourth time period.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using configurable storage blocks is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. A configurable storage circuit comprising:
   an address port;
   a memory array;
   arithmetic circuitry; and
   a control block that is coupled between the memory array and the address port and that is coupled to the arithmetic circuitry, wherein the control block selects an address signal from the address port to access storage locations in the memory array in a first access mode, and wherein the control block selects a computed signal from the arithmetic circuitry to access storage locations in the memory array in a predetermined sequence in a second access mode.

2. The configurable storage circuit of claim 1, further comprising:
   a data input port coupled to the memory array, wherein the memory array receives data from the data input port, and wherein the control block directs the memory array to store the data at storage locations based on the address signal in the first access mode and to store the data at storage locations based on the computed signal in the second access mode.

3. The configurable storage circuit of claim 1, further comprising:
   a data output port coupled to the memory array, wherein the control block directs the memory array to retrieve data from storage locations based on the address signal in the first access mode and from storage locations based on the computed signal in the second access mode and to provide the retrieved data at the data output port.

4. The configurable storage circuit of claim 1, further comprising:
   an enable port that is coupled to the memory array and that receives an enable signal, wherein the enable signal enables writing to the memory array.

5. The configurable storage circuit of claim 4, wherein the arithmetic circuitry comprises:
   a counter that is coupled to the enable port and the memory array and that receives the enable signal from the enable port and increases a write address of the memory array based on the enable signal.

6. The configurable storage circuit of claim 5, wherein the counter comprises:
   a register that stores the write address;
   an increment element that receives the stored write address from the register and increases the stored write address by a predetermined number to produce an incremented write address; and
   a multiplexer that receives the enable signal, the stored write address, and the incremented write address and that selects between the stored write address and the incremented write address based on the enable signal to produce a selected write address.

7. The configurable storage circuit of claim 6, further comprising:
   an additional multiplexer that receives an external address signal from the address port and the selected write address from the multiplexer, wherein the multiplexer selects the external address signal in the first access mode and the selected write address in the second access mode.

8. The configurable storage circuit of claim 5, wherein the arithmetic circuitry further comprises:
   a subtractor that receives the write address from the counter and an external address signal from the address port, wherein the subtractor computes a read address signal based on the write address and the external address signal.

9. The configurable storage circuit of claim 8, further comprising:
   a multiplexer that receives the external address signal from the address port and the read address signal from the subtractor, wherein the multiplexer selects the external address signal in the first access mode and the read address signal in the second access mode.

10. The configurable storage circuit of claim 1, wherein the control block implements a first-in first-out (FIFO) circuit in the second access mode.

11. The configurable storage circuit of claim 1, wherein the control block implements a shift register circuit in the second access mode.

12. A method for controlling a storage circuit using a control circuit and an arithmetic circuit, comprising:
receiving a first signal from an address port at the control circuit, wherein the control circuit is coupled between the storage circuit and the address port;
generating a second signal using the arithmetic circuit;
sending the second signal from the arithmetic circuit to the control circuit; and
using the control circuit to select between first and second access modes, wherein the first access mode provides random access to the storage circuit at a first storage location that is based on the first signal, and wherein the second access mode provides access to storage locations in the storage circuit in a predefined sequence starting at a second storage location based on the second signal.

13. The method of claim 12, further comprising:
receiving a delay-line length signal with the arithmetic circuit; and
using the arithmetic circuit to compute a third signal based on the second signal and the delay-line length signal, wherein the third signal identifies a third storage location of the storage circuit, and wherein the second and third storage locations have a distance from each other that is based on the delay-line length signal.

14. The method of claim 13, further comprising:
receiving a reset signal with the arithmetic circuit; and
using the arithmetic circuit to update the second signal to identify an initial storage location of the storage circuit.

15. The method of claim 14, further comprising:
using the arithmetic circuit to update the third signal to identify a second initial storage location of the storage circuit, wherein the initial storage location and the second initial storage locations have a distance from each other that is based on the delay-line length signal.

16. The method of claim 12, further comprising:
incrementing the second signal with a counter circuit in the arithmetic circuit to generate a third signal that identifies a third storage location of the storage circuit.

17. The method of claim 16, further comprising:
receiving a delay-line length signal with the arithmetic circuit; and
using the arithmetic circuit to compute a fourth signal based on the third signal and the delay-line length signal, wherein the fourth signal identifies a fourth storage location of the storage circuit, wherein the third and fourth storage locations have a distance from each other that is based on the delay-line length signal.

18. The method of claim 16, further comprising:
receiving an enable signal with the arithmetic circuit; and
disabling incrementing the second signal with the counter circuit based on the enable signal.

19. A method for operating a random-access memory block, comprising:
performing a write operation to store a first data set at a first address of the random-access memory block during a first time period;
using a first arithmetic circuit to compute a second address of the random-access memory block, wherein the first and second addresses have a distance from each other that is based on a delay-line length; and
performing a read operation to retrieve a second data set from the second address of the random-access memory block during the first time period.

20. The method of claim 19, further comprising:
using a second arithmetic circuit to compute a third address of the random-access memory block that is adjacent to the first address of the random-access memory block; and
performing a write operation to store a third data set at the third address of the random-access memory block during a second time period that is different than the first time period.

21. The method of claim 20, further comprising:
performing a read operation to retrieve a fourth data set from a fourth address of the random-access memory block during a third time period.

22. The method of claim 21, further comprising:
receiving the fourth data set at an additional random-access memory block; and
performing a write operation to store the fourth data set at a fifth address of the additional random-access memory block during a fourth time period.

23. The method of claim 21, further comprising:
concatenating a fifth data set with the fourth data set to form a sixth data set; and
performing a write operation to store the sixth data set at a fifth address of the random-access memory block during a fourth time period.

24. The method of claim 21, further comprising:
concatenating a fifth data set with a sixth data set to form a seventh data set; and
performing a write operation to store the seventh data set at a fifth address of the random-access memory block during a fourth time period.

* * * * *